United States Patent [19]

Cellai

[11] Patent Number: 4,807,018
[45] Date of Patent: Feb. 21, 1989

[54] METHOD AND PACKAGE FOR DISSIPATING HEAT GENERATED BY AN INTEGRATED CIRCUIT CHIP

[75] Inventor: Marino Cellai, Agrate Brianza, Italy

[73] Assignee: SGS Microelettronica S.p.A., Italy

[21] Appl. No.: 113,408

[22] Filed: Oct. 26, 1987

Related U.S. Application Data

[63] Continuation of Ser. No. 888,049, Jul. 18, 1986, abandoned.

[30] Foreign Application Priority Data

Oct. 10, 1985 [IT] Italy ................................ 22428 A/85

[51] Int. Cl.[4] .......................................... H01L 23/02
[52] U.S. Cl. ........................................ 357/70; 357/81; 437/209; 437/220
[58] Field of Search ................... 357/70, 81; 437/209, 437/220

[56] References Cited

U.S. PATENT DOCUMENTS 4,124,864 11/1978 Greenberg ............................ 357/81
4,621,279 11/1986 Maier et al. .......................... 357/83

FOREIGN PATENT DOCUMENTS 57-94560 11/1982 Japan ................................ 357/70
58-16555  1/1983 Japan ................................ 357/70
59-72755  4/1984 Japan ................................ 357/81

Primary Examiner—Andrew J. James
Assistant Examiner—Mark Prenty
Attorney, Agent, or Firm—Harry M. Weiss

[57] ABSTRACT

An integrated circuit package having a semiconductor integrated circuit chip thermally and mechanically coupled to a cooling plate is described. The leadframe conductors for the package have bent end portions to bring the conductors in close proximity to the integrated circuit chip. The bent end portions of the leadframe conductors are coated with an electrically insulating material such as a varnish comprising a Teflon-based lacquer with suitable high temperature properties for permitting mechanical and thermal contact of the leadframe conductors to the heat sink or the cooling plate without electrical connection thereto. One of the leadframe conductors is adapted to engage an aperture in the cooling plate to provide a positioning mechanism and increased mechanical connection between the leadframe conductors and the cooling plate. By configuring the leadframe in an appropriate manner, conducting wires can be coupled to the chip on three sides thereof from the bent end portions of the leadframe conductors.

5 Claims, 1 Drawing Sheet

METHOD AND PACKAGE FOR DISSIPATING HEAT GENERATED BY AN INTEGRATED CIRCUIT CHIP

This is a continuation of co-pending application Ser. No. 888,049, filed on July 18, 1986, now abandoned.

BACKGROUND OF THE INVENTION

1. Field of the Invention

This invention relates generally to an improved method and package for dissipating heat generated by a semiconductor chip and, more particularly, to an improved method and package for dissipating a large amount of thermal energy from an integrated circuit chip.

2. Background of the Invention

In integrated circuit chips that generate a relatively large amount of heat (for example, because of the presence and use of a high density or amount of semiconductor components which may include high heat producing power devices that are formed in and become a part of the integrated chip structure), the heat must be conducted away from the chip. Otherwise, the rise in temperature can compromise or detrimentally affect the performance of the circuit and may even cause the destruction of one or many components thereby creating a circuit failure. Numerous techniques have been devised to improve the dissipation of heat away from the integrated circuit chip and thereby achieve, in effect, the cooling of the package containing the integrated circuit chip. Thermally coupling the integrated circuit chip to a heat sink is a frequently performed solution to the problem of heat dissipation. However, the package housing is frequently comprised of a poor thermal conductor such as a plastic or resin dielectric or insulating material used as a housing or encapsulating material, thereby limiting the effectiveness of a heat sink in contact with the dielectric portion of the housing package.

It is known in the related art to couple the integrated circuit chip to a thermal conductor or heat sink element that is part of the package housing to permit superior conduction of heat away from the integrated circuit package. However, the packages that have a heat sink element or, effectively, a cooling plate directly and mechanically coupled to the integrated circuit chip have, in the past, been difficult to fabricate and effectively use with integrated circuit chips. In addition, the electrically conducting leads of the package that are used for electrically coupling the various electronic components or circuit functions of the integrated circuit chip with the external circuitry typically require and use very fine line electrically conducting wires which are very fragile and need to be securely attached to the electrically conducting leads of the package. Problems have been encountered in providing leadframe conductors that can provide good electrical contact (via the fine line wires) to desired portions of the chip, that can also provide a good mechanical and thermal connection to a cooling plate, and that can further provide electrical isolation between a metal heat sink or cooling plate and the individual leadframe conductors.

A need was therefore felt for an improved integrated circuit package in which the integrated circuit chip is coupled to a heat dissipating element or heat sink member to thereby provide a cooling plate. The improved package is preferably fabricated using leadframe conductors or the leadframe technology and provides the solutions to the above identified problems. Moreover, the leadframe conductors are preferably coated, at least on the portions thereof in contact with the heat sink member, with an electrically insulating, thin, varnish material coating, such as a Teflon-based lacquer, which still permits both good thermal and mechanical contact with the heat sink member or cooling plate. This varnish material is suitable for retaining electrical insulation between the leadframe conductors and the heat sink member or cooling plate and is stable and will not break down at higher temperatures in order to insure proper semiconductor (device or integrated circuit) operation at operating temperatures (i.e., approximately 175° C.). Therefore, this varnish material is long lasting, durable and will not degrade or become damaged, especially when subjected to heating operations or procedures during the semiconductor package assembling process. Both mechanical and thermal stresses are appropriately tolerated or absorbed by this varnish material. More particularly, this varnish insulating material is suitable for being applied in a varnish-like fashion which is a significantly reliable, economical and rapid coating process. Further, this material can be applied or deposited at high accuracies (e.g., within ±0.10mm), especially when applied to metal leadframes. Still further, the metal leadframes with this varnish material coating can be mechanically sheared without detaching or striping off this varnish coating from the substrate or leadframe to which the coating is attached. Additionally, the metal lead frame with its attached thin electrically insulating, varnish material coating can still be dipped into baths for electrolythic plating operations, as desired, without damaging the varnish material coating.

SUMMARY OF THE INVENTION

It is an object of the present invention to provide an improved method and package for dissipating heat generated by a semiconductor chip.

It is another object of the present invention to provide an improved method and package for dissipating heat generated by an integrated circuit chip thereby effectively permitting the efficient cooling of the integrated circuit chip.

It is a more particular object of the present invention to provide an improved method and leadframe package which uses end portions of the bent leads of the leadframe conductors of the package for providing improved mechanical and thermal connections to the heat sink or cooling plate of the package while simultaneously providing electrical isolation between individual leadframe conductors and the metal heat sink or cooling plate.

The aforementioned and other objects are accomplished, according to the present invention, by an improved method and package in which a metal heat sink, which extends outside of the package housing, is thermally and mechanically coupled to the semiconductor chip. A leadframe of the package is mechanically coupled to the cooling chip and the leads are bent to be in good mechanical and thermal contact with metal heat sink and wires electrically couple the frame leads and three sides of the semiconductor chip. The leadframe is structured to permit electrical access to the semiconductor chip from three directions. Moreover, the leadframe conductors are preferably coated with a varnish material, such as a Teflon-based lacquer, which still permits good mechanical and thermal contact with the cooling plate without electrical contact thereto due to the insulating nature of the varnish materials.

DESCRIPTION OF THE PREFERRED EMBODIMENT

In accordance with one embodiment of the present invention, a package for a semiconductor chip is described that includes a metal heat sink, a chip having semiconductor elements coupled to the heat sink, and a lead frame having bent leads for engaging the heat sink to dissipate heat generated by an integrated circuit chip thereby effectively permitting the efficient cooling of the integrated circuit chip. A key feature of the package is the use of an insulating coating preferably in the form of a thin varnish material comprising a Teflon-based lacquer on the portion of the bent leads of the leadframe that engage or make contact to the heat sink which permits the leadframe bent end portions to make good mechanical and thermal contact to the heat sink, but yet provide electrical isolation of each bent lead portion from the other bent lead portions.

In accordance with another embodiment of the present invention, a method of fabricating a package containing an integrated circuit chip is disclosed. The method includes the steps of thermally coupling the integrated circuit chip to a cooling plate, and adapting a leadframe to mechanically engage the cooling plate. A key step of the method is providing an insulating coating preferably in the form of a thin varnish material comprising a Teflon-based lacquer on portions of the leadframe to permit good mechanical and thermal contact to the cooling plate, but yet provide electrical isolation of each portion of the leadframe that contacts the cooling plate from the other portions of the leadframe that contact the cooling plate.

These and other features of the invention will be understood upon reading of the following description along with the drawings.

DESCRIPTION OF THE PREFERRED EMBODIMENT

Detailed Description of the Drawings

Figure 1:
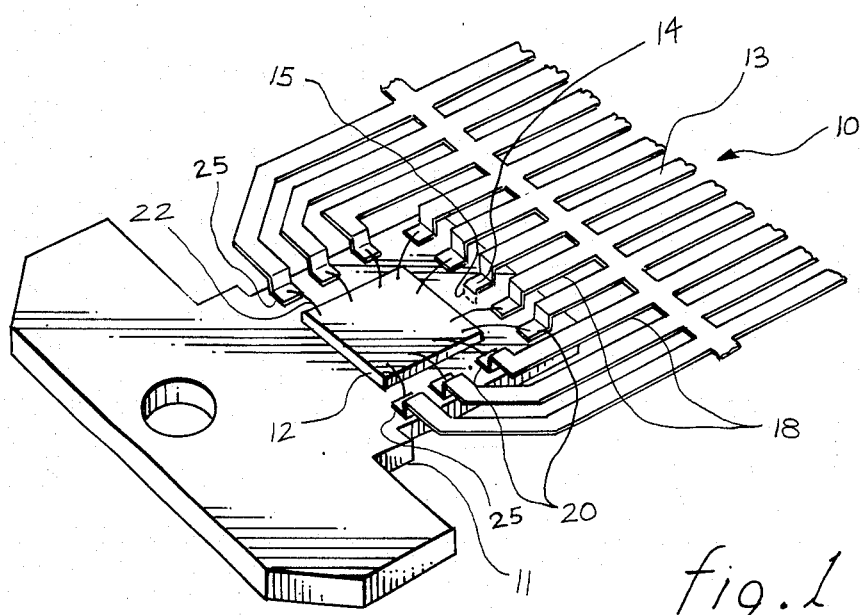
FIG. 1 is an exploded view of the integrated circuit package of the instant invention.

Referring to FIG. 1, a perspective view of the package 10 according to the present invention is shown. An electronic integrated circuit chip 12 is coupled to heat sink or cooling plate 11. Leadframe 13 has a protruding member 14 that can be inserted in aperture 15 to secure the leadframe 13 to the cooling plate 11. The end portions of metal conductors 18 of the leadframe 13 are bent to form bent end conducting leads 20 in mechanical and thermal contact with the cooling plate 11 and these leads 20 are located interior to the package housing (see FIG. 2), while the exterior portion (generally designated as 30 in FIG. 2) is at a standard leadframe height. In addition, the bent end conducting leads 20 of the leadframe 13 are configured to permit coupling of fine line wires 22 formed by wire bonding techniques to three sides of the semiconductor or integrated circuit chip 12. The conducting leads 20 are preferably coated with an insulating material such as a thin electrically insulating, varnish material coating 25 which, in the preferred embodiment, is a Teflon-based lacquer such as produced commercially and sold under the Trade name Appliflon M/20 by AppliFrance which is a French company. The insulating material coating 25 prevents each of the leads 20 from being in electrical contact with the heat sink or cooling plate 11.

Figure 2:
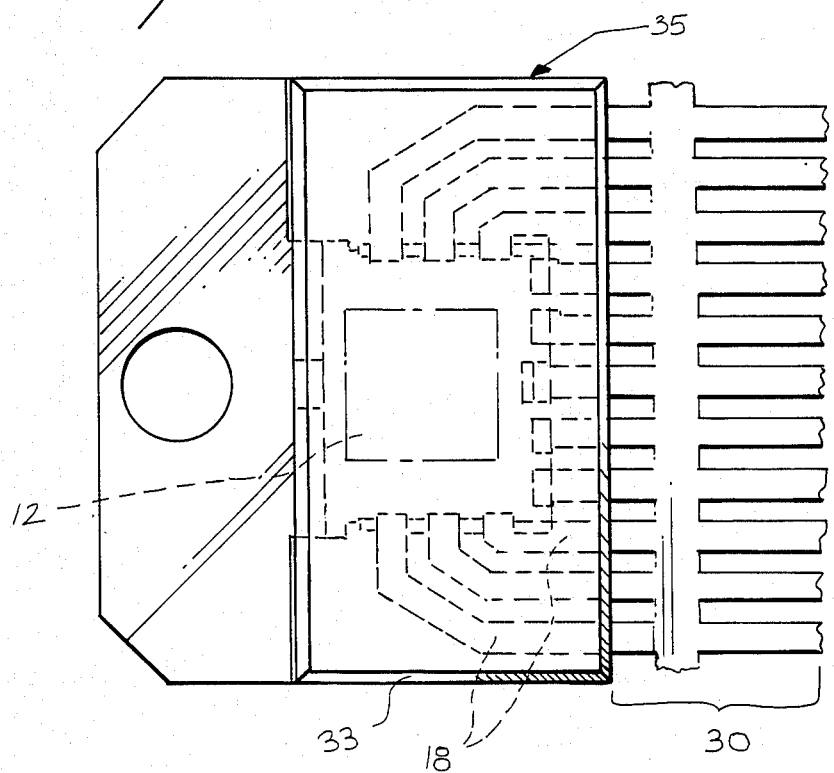
FIG. 2 is a top view of the leadframe, with the package housing in place, according to the instant invention.

FIG. 2 is a top view showing the exterior portion 30 of the leadframe 13 when the integrated circuit chip package housing 33 is in place. The positioning of the metal conductors 18 in the interior portion of the housing 33 is shown in dotted lines. The bent end portions of the metal conductors permits fine line wires (not shown) to electrically couple the metal conductors 18 located on three sides of the semiconductor chip 12 to the chip 12 to provide a complete integrated circuit package 35 of the present invention.

Operation of the Preferred Embodiment

The integrated circuit package of this invention is adapted to take advantage of the leadframe technology for fabrication of relatively low cost fully packaged semiconductor components, while providing a package in which the integrated circuit chip is mechanically and thermally coupled to a cooling plate. The cooling plate provides a large thermal mass for effectively dissipating heat generated by an integrated chip by providing a path with high thermal conducting properties to a cooling plate. Fine line electrically conductive wires are bonded to both the bent lead end portion of the leadframe of the package and the three sides of the electrically conductive external pads or terminals (not shown) of the integrated circuit chip. The present packaging arrangement and method permits electrical attachment of the conducting leads of the leadframe to three sides of the semiconductor or integrated circuit chip.

The insulating coating 25 that is used herein is especially useful in the packaging of power integrated circuits in doubleframe housings. The advantages of the bent end portions 20 permits a reduction of costs because shortened gold wires used for wire bonding can be utilized. The improved wire bonding operation, because of the easier attachment of the wires to the bent end portions, reduces the problems of intermittency that could occur from faulty electrical connections. Finally, increased yields in the wire bonding operation can now occur since losses from part rejections can be minimized in the handling of the leadframes because of the significant improved arrangement of the package of this invention.

The above description is included to illustrate the preferred embodiment and is not meant to limit the scope of the invention. The scope of the invention is to be limited only by the following claims. Many variations will be apparent to one skilled in the art that would yet be encompassed by the spirit and scope of the invention.

What is claimed is:
1. A package for a semiconductor chip comprising:
   a metallic heat sink;
   a semiconductor chip mounted on said heat sink;
   lead frame means for enabling electrical connection to said chip, said lead frame means comprising a plurality of inner conductive end portions each having one surface facing said heat sink; and
   thin coating means located on said lead frame means for providing electrical isolation between said lead frame means and said heat sink, said coating means being coextensive with each of said plurality of inner conductive end portions only on the one surface of each of said plurality of inner conductive end portions facing said heat sink.

2. The package according to claim 1, where said heat sink faces said thin coating means only where said heat sink faces said lead frame means.

3. The package according to claim 1, wherein said thin coating means comprising Teflon.

4. A method of fabricating a package containing a semiconductor chip thermally coupled to a cooling plate comprising the steps of:

forming a metallic sheet to provide a metallic lead frame having a plurality of inner conductive end portions;

mounting said conductive end portions of said lead frame over said cooling plate so that one surface of each of said plurality of inner conductive end portions faces said cooling plate; and coating said plurality of inner conductive end portions facing said cooling plate with a thin insulating material for electrically insulating said conductive end portions from said cooling plate, said coating of thin insulating material being coextensive with each said one surface of each of said plurality of inner conductive end portions facing said cooling plate.

5. The method according to claim 4 wherein said thin insulating coating comprising Teflon.

* * * * *